INVENTOR
HERMANN STATZ
BY H. Vincent Harsha
ATTORNEY

INVENTOR
HERMANN STATZ
BY H. Vincent Harsha
ATTORNEY

INVENTOR
HERMANN STATZ
BY H. Vincent Harsha
ATTORNEY

United States Patent Office 3,083,342

Patented Mar. 26, 1963

3,083,342

SEMICONDUCTOR DEVICES UTILIZING INJECTION OF CARRIERS INTO SPACE-CHARGE REGIONS

Hermann Statz, Wayland, Mass., assignor to Raytheon Company, Lexington, Mass., a corporation of Delaware

Filed Oct. 15, 1959, Ser. No. 846,648
4 Claims. (Cl. 331—111)

This invention relates generally to electrical signal translation devices of the type which comprise a semiconductive body containing an impurity material or materials which alter the electrical conductivity characteristics of the semiconductive body. More particularly, the present invention relates to semiconductive devices of the type which have been designated as "spacistors."

Recent years have witnessed the discovery and development of a new type of electrical translation device comprising a body of semiconductive material, such as germanium or silicon, which is provided with adjacent zones or regions having different electrical conductivity characteristics. The electrical conductivity characteristics are determined by the presence of minute traces of impurity materials which result in either N-type or P-type conduction. A zone is thus designated as a P or an N zone depending upon the predominance of the impurity material contained therein, and the interface between two opposite type zones is designated as a P-N (N-P) junction. Devices of this type in which a single zone of one conductivity-type materials, as for example, N-type, is positioned intermediate two zones of opposite conductivity-type material, such as P-type, are known in the art as P-N-P transistors. Conversely, devices in which the intermediate zone is of P-type material and in which the two outer zones are N-type material have been designated as N-P-N transistors.

In addition to the foregoing type of device, there has also recently been proposed a semiconductive device in which the current carriers are injected directly into a space-charge region established in the vicinity of a P-N junction in the body in order to overcome some of the deficiencies of the prior art transistors, particularly with respect to the range of frequency response. Such devices have been designated as "spacistors," and are described in my copending application, Serial No. 672,046, filed July 15, 1957. In the spacistor there described, only one kind of current carrier, for example, either holes or electrons, are injected into the space-charge region. I have found that devices of this class may be utilized to advantage if, rather than injecting only one type of current carrier into the space-charge region, means are provided to simultaneously cause both types of current carriers to be injected into the space-charge region. The phenomena involved, and the manner of operation of the devices of the present invention differ considerably from that of my previously disclosed spacistor.

Accordingly, the present invention is directed toward the realization of a semiconductive device of the spacistor type in which both holes and electrons are simultaneously injected into a space-charge region established in said device. Briefly, this result may be accomplished by providing a body of semiconductive material containing a P-N junction with a small P-type, and a small N-type contact, both located within the confines of the space-charge region established under bias conditions of device operation. Both the P-type and the N-type contact are biased in the forward direction with respect to the potential of the underlying space-charge region. As a result of this biasing arrangement, potential maxima and minima are established around the P and N-type contacts. Holes emitted from the forward biased P-type contact flow toward the N-type contact where they are trapped in front of the N-type contact. These holes neutralize some of the space-charge which was produced by the emitted electrons, and an enhancement of the electron current out of the N-type contact takes place. These electrons from the N-type contact flow toward the P-type contact where they tend to become trapped in a similar manner.

In the instance where the device is utilized as an amplifier, modulating the current injected by the P-type contact will produce a modulation of the current flowing out of the N-type contact. This modulation action results from the simultaneous occurrence of two different phenomena, namely, the modulation action of the field immediately in front of the N-type contact, and the fact that number of holes trapped in front of the N-type contact depends upon the injected hole current. Since the electron injection by the N-type contact is a strong function of the hole-produced space-change region in front of the N-type contact, the space-charge effect of the trapped holes thus produces a dependance of the injected electron current on the injected hole current.

The invention will be better understood as the following description proceeds taken in conjunction with the accompanying drawings wherein.

Figure 1:
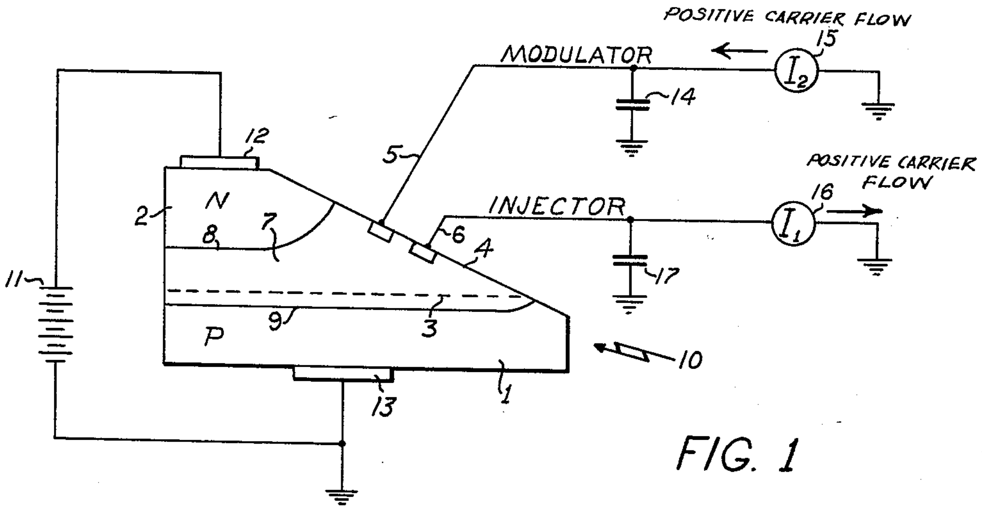
FIG. 1 is a schematic representation of a device in accordance with the present invention utilized as an oscillator.

Referring now to the drawings, and more particularly to FIG. 1 thereof, there is shown a device comprising a body of semiconductive material 10, having a P-type region 1 and an N-type region 2 separated by a P-N junction 3. The body 10 may be fabricated in any convenient manner well known in the art, as by growing a crystal from a molten mass of semiconducting material, and alternately doping the melt with suitable impurity materials in order to form the P-type region 1 and the N-type region 2 with P-N junction 3 between the two regions. Alternatively, the junction 3 may be formed in any other well known manner, as by alloying suitable impurity materials into the body 10, or by diffusing the impurity materials into the body. The semiconductive body 10 is preferably composed of germanium or of silicon. However, the principles of the present invention are not limited to the use of germanium and silicon, but are intended to include any materials of the class number as semiconductors, which have their electrical conductivity characteristics altered by the inclusion of a conductivity type-determining impurity element therein. In addition to germanium and silicon, other semiconductors include silicon carbide and the so called intermetallic compounds formed from metallic elements of groups III and V of the periodic table according to Mendelyeev. For example, these may include indium antimonide, indium phosphide, indium arsenide, gallium antimonide, etc. It should be noted that since the above-mentioned intermetallic compounds are composed of materials which separately are considered as impurity elements when introduced into materials selected from group IV of the periodic table, the intermetallic compounds formed therefrom may be N or P-type depending upon the degree of unbalance in the atomic proportions of the materials constituting the body, or depending upon the controlled inclusion of other suitable conductivity-type determining impurities therein, such as, for example, impurity elements selected from groups II and VI of the periodic table.

As shown, the body 10 is preferably provided with a beveled surface 4 in order to make it more convenient to attach a modulating contact 5 and an injecting contact 6 to the body 10, and have these contacts lie within the confines of a space-charge region 7 established in the body 10. In FIG. 1, the lines 8 and 9 represent the outside edges of the space-charge region 7. The P-type region 1 is connected to the N-type region 2 through a source of biasing voltage 11. As shown, the positive terminal of the battery 11 is connected to an electrode 12 in contact with the N-type region, while the negative terminal of the battery 11 is connected to an electrode 13 attached to the P-type region 1 thereby biasing the junction 3 in the so-called reverse direction, and creating the space-charge region 7 extending chiefly into N-type region 2. The body 10 also has connected thereto a small P-type contact 5, and a small N-type contact 6. These contacts are preferably made by alloying suitable impurity materials into the body 10. However, these contacts may also be pressure-type contacts as disclosed in the above referred to spacistor application.

The outside circuitry connected to the device of FIG. 1 is so chosen that the device will function as a relaxation-type oscillator. To this end, the P-type modulator contact 5 is connected to an appropriate current source 15, the other side of which is grounded. Additionally, the contact 5 is connected to one side of a capacitor 14, the other side of which is connected to ground. N-type contact 6 is similarly connected to one side of a current source 16, the other side of which is grounded, and the contact 6 is also connected to the ungrounded side of an injector capacitor 17.

In order to provide a background to the inventive concept involved in the present application, it will prove advantageous to first consider the flow of electrons and holes in "neutral" semiconductive bodies, that is, in the portions of such bodies which are outside any space-charge region which may be established by a reversed bias junction. If, for example, holes are injected into a neutral N-type semiconductive body, the density of the electrons will be increased such that for each injected hole there will be an additional electron found in the immediate vicinity of the hole. The semiconductive body itself will always be free of any space-charge. This situation is to be contrasted to that found within space-charge regions of reversed biased junctions. Devices have been proposed in which electrons or holes alone are injected into such regions, the previously referred to spacistor, for example, utilizing the injection of only one kind of carrier into the space-charge region. In accordance with the present invention, it has been found that improved devices may be attained by simultaneously injecting both electrons and holes into the space-charge region of a reversed-biased junction, and by utilizing the electrostatic interaction between the two types of carriers to exert control over the flow of current in the device. Devices in accordance with the present invention, therefore, while similar in appearance to the spacistor, depend upon a different principle for their operation.

Figure 2:
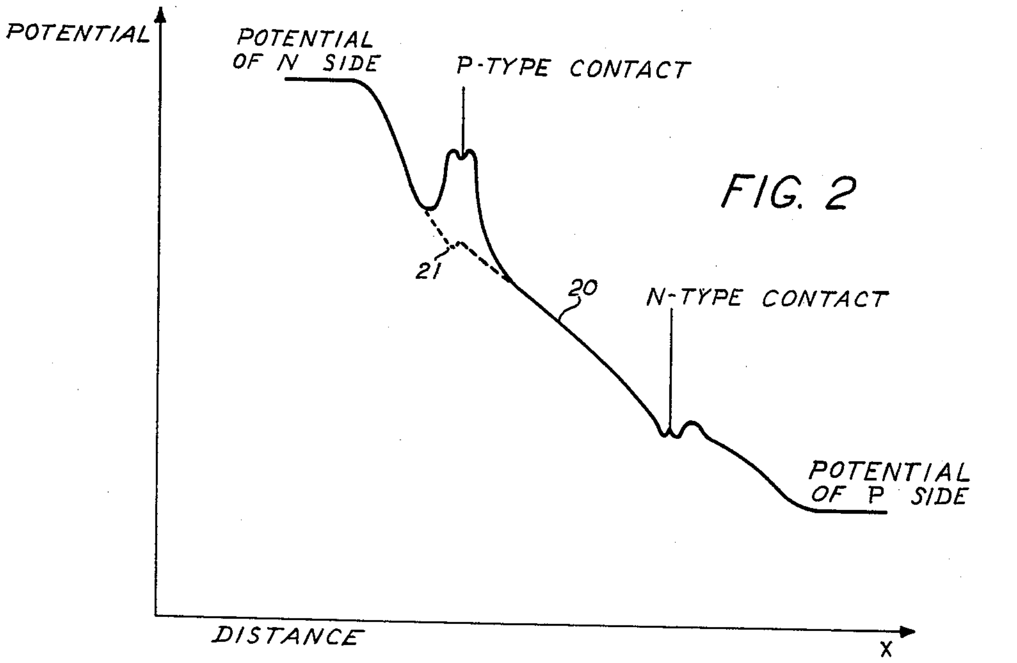
FIG. 2 is a graph showing the potential profile extending along the surface of the device of FIG. 1 from the P region through the N and P-type contacts to the N region.

As previously described with respect to FIG. 1, the outside circuitry associated with the semiconductive body 10 is chosen so that the device of FIG. 1 functions as a relaxation type of oscillator. The nature of the oscillations will be understood better from a consideration of FIG. 2, which shows the potential profile along a line extending along a surface of the body 10 from the P-region through the N and P contacts to the N region, the line 20 representing this profile. Around the N and P-type contact regions there are established potential minima and maxima. Some of the holes emitted from the forward biased P-type contact 5 in FIG. 1 flow toward the N-type contact 6 where they are trapped in the electron well in front of the N-type contact. These holes partially neutralize the space-charge caused by the flowing electrons, and since the injector contact 6 is held at a fixed potential by the external capacitor 17, a greatly increased flow of electron current out of the N-type contact into the body 10 is realized. The net result of this action is that the injector conductance is increased. The increased electron flow causes more electrons to be trapped under the modulator contact 5 which, in turn, through space-charge neutralization, causes an increased hole flow. This increased hole flow again causes an increased trapping-rate of holes under the injector 6, and the electron current increases. This mutual build-up of current while the applied voltages across the capacitors are decreasing in absolute value relative to ground, may be referred to as negative resistance between ground and either the N- or P-type contact. This negative resistance results in the observed relaxation-type oscillations.

Figure 6:
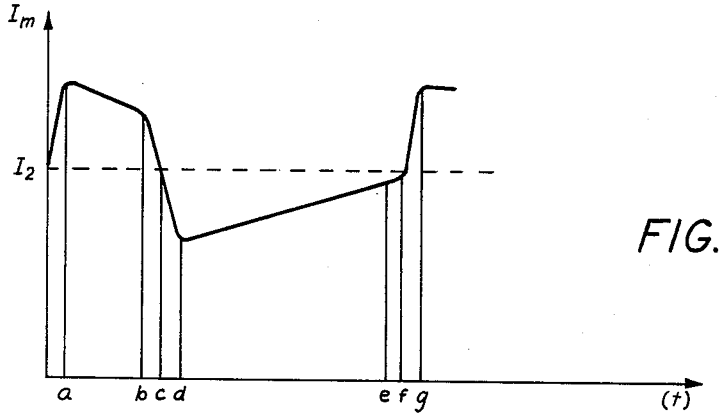
FIG. 6 is a plot of the current into the modulator contact versus time for the oscillatory circuit shown in FIG. 1.

The manner in which the circuit of FIG. 1 oscillates may be further understood by reference to FIG. 6 which shows a plot of the current into the modulator contact 5 versus time. At time *a*, as indicated in FIG. 6, the current flowing into the modulator contact 5 and the voltage on the modulator capacitor 14 are near their maximum values. Since the modulator current is higher than that which can be supplied by the current source 15, the deficiency must be provided by the capacitor 14. Accordingly, during the interval from *a* to *b* capacitor 14 commences to discharge, and its voltage drops as does the current it supplies. This discharge continues until the potential minimum in front of the P-type contact 6 has practically disappeared, as indicated by the dotted portion 21 of line 20 in FIG. 2. As has been previously recited, the function of the holes injected by the modulator 5 is to be trapped under the injector 6 and thereby cause or induce an increased flow of electrons from injector 6, most of these electrons injected by contact 6 finding their way to the output circuit. However, some will become trapped in the shallow electron well under the modulator 5, and will thus induce an increase in the hole flow from the modulator. These additional holes in turn promote a still further increase in the electron flow from the injector. As will be described at a later point in this specification, it is this regeneration process which causes the current to attain the high value shown at time *a* in FIG. 6. It must also be borne in mind for later consideration that recombination of the holes and electrons is constantly occurring in each of the wells under the contacts 5 and 6.

Having thus described the regeneration process, consideration of the rest of the cycle of oscillation is in order. Referring again to FIG. 6, it can be seen that during the interval from *a* to *b*, the current increase described above is still high. Due to the decrease in contact current during this time period, the arrival rate of electrons under the modulator 5 approaches the recombination rate, as at point *b*. At this moment, the enhancement of the current decreases rapidly, and the current degenerates to a low value eventually reaching the value of source 15 as indicated at time *c* in FIG. 6. This is not a stable point because the voltage across the capacitor 14 has fallen to a value which is to low to sustain this current, and consequently the modulator current continues to decrease below the value of source 15. Since the source 15 is supplying a constant amount of current, the excess must flow into the capacitor 14 which then starts to charge in a positive direction from point *c*. The current drawn by the modulator 5 attains a minimum value at time *d* at which point it is low enough to be sustained by the mod-ulator voltage. Again, stable conditions cannot result since an excess charging current still remains. At this time, however, the resulting rising modulator voltage can sustain larger and larger modulator currents so both of these quantities increase until time *e* is reached, with the increasing hole current slowly overtaking the effect of recombination, and triggers the regeneration process described previously resulting in a rapid rise in modulator current, the current at time *f* being equal to the amount which can be supplied by the current source 15. At point *f*, however, instability again results since the current is too low for the modulator voltage, and, therefore, the current continues to rise. At this point, the capacitor 14 starts to discharge again, and the slope of the voltage curve reverses in sign. The current continues to rise to the value shown at *g*, corresponding to the previous point *a*, at which point the cycle proceeds to repeat. Although the cause for oscillations has been explained by considering the modulator contact in detail, a similar process occurs simultaneously under the injector 6, and it is the interaction of these two processes which is responsible for the negative resistance oscillations. The polarity of the voltage on the injector is reversed as shown in FIG. 3.

Figure 3:
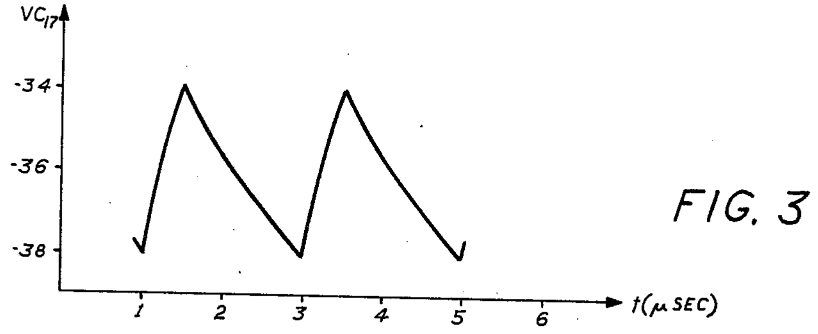
FIG. 3 is a wave-form plot of the voltage across the injector capacitor versus time for the oscillatory circuit shown in FIG. 1.
Figure 4:
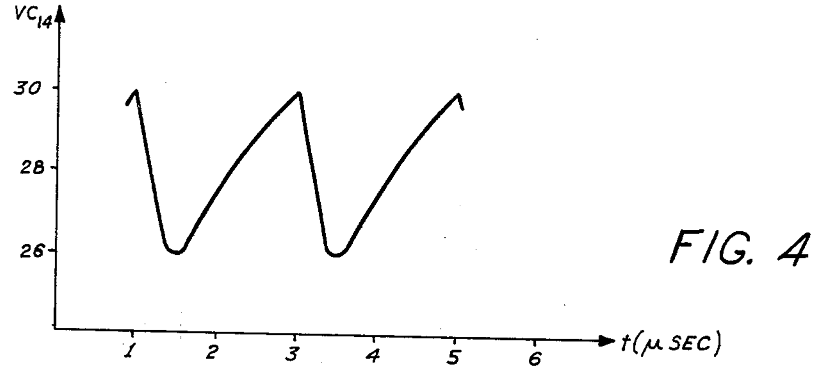
FIG. 4 is a wave-form plot of the voltage on the modulator capacitor versus time for the oscillatory circuit shown in FIG. 1.
Figure 5:
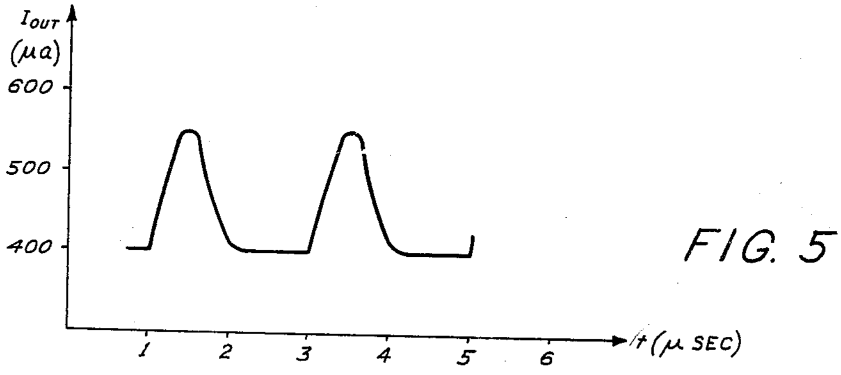
FIG. 5 is a wave-form plot of the output electron current versus time for the oscillatory circuit shown in FIG. 1.

FIGS. 3, 4, and 5 show the wave forms obtained on a device connected as in FIG. 1 wherein the following values for the various elements were used:

Capacitor 14=20 microfarads;
Capacitor 17=20 microfarads;
Current $I_1$=500 microamps.; and
Current $I_2$=65 microamps.

Figure 7:
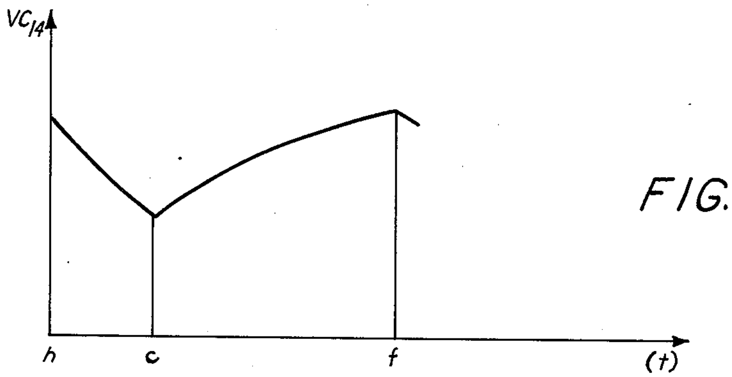
FIG. 7 is a plot of the voltage on the modulator capacitor versus time for the oscillatory circuit shown in FIG. 1.

FIG. 4, the wave-form of the modulator voltage, corresponds to FIG. 7, the difference in appearance being due to the fact that two curves are plotted on a different scale. In FIG. 7, the points *c* and *f* correspond to the points *c* and *f* of FIG. 6. The wave-form of FIG. 6 was obtained with the circuit values recited above.

Figure 8:
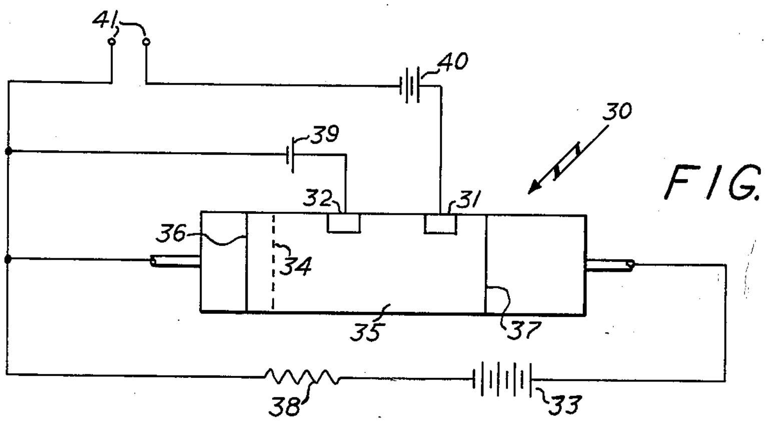
FIG. 8 is a greatly exaggergated schematic diagram of an alternative form of device in accordance with the present invention in which the device is utilized as an amplifier.

Referring now to FIG. 8, there is shown a greatly exaggerated somewhat diagrammatic view of an alternative form of arrangement in accordance with the present invention in which the semiconductive device is utilized as an amplifier. In FIG. 8, the semiconductive body 30 is provided with a P-type modulator contact 31 and an N-type injector contact 32. The battery 33 biases the P-N junction 34 in the reverse direction to create the space-charge region 35, the boundaries of which are indicated by the lines 36 and 37. The output circuit includes a suitable impedance element such as the resistor 38. The injector contact 32 is biased in the forward direction by the battery 39, while the modulator contact 31 is biased in the forward direction by the battery 40. A signal to be amplified may be applied between the terminals 41 from any suitable source (not shown), and an amplified replica of the signal will appear across the resistor 38 included in the output circuit. In this case, no oscillations are possible, since oscillations can only exist if the internal feedback through hole-trapping in front of the injector 32 and electron-trapping in front of the modulator 31 is strong enough to cause net negative resistance. For relatively low forward currents of the modulator, no oscillations are observed experimentally. Holes trapped in front of the injector neutralize some of the electron space-charge, and a net increase of the forward conductance of the injector 32 is achieved. More accurately, two phenomena contribute to the increase in transconductance as compared to a conventional spacistor. Besides the above-mentioned increase in injector conductance, the number of holes emitted from the modulator varies in accordance with the applied signal, and thus, the trapped hole charge in front of the injector varies simultaneously. Experimentally, by utilizing this arrangement, a $g_m$ value of 230 micromhos was measured, an increase of more than a factor of 10 for the particular unit being tested. By modulating the current injected between P-type contact 31, control or modulation of the current injected between N-type contact 32 is achieved due to the simultaneous modulation process previously described. Since, in this embodiment, trapping of electrons in front of the P-type modulation contact 31 is undesirable, this effect may be minimized by only slightly forward biasing the P-type contact, or by the use of a deflecting magnetic field to disperse the electrons.

Although there have been described what are considered to be preferred embodiments of the present invention, various adaptations, and modifications thereof may be made without departing from the spirit and scope of the invention as defined in the appended claims.

What is claimed is:

1. In combination, a semiconductive device comprising a body of semiconductive material having regions of different electrical conductivity type material, biasing means for creating a space-charge region in said body around and including a junction between said regions of different electrical conductivity type material, an output circuit comprising a suitable impedance element in series with said biasing means across said regions of different electrical conductivity-type material, at least two contacts to said body for controlling current carrier flow through said body, said contacts being included within the confines of said space-charge region, one of said contacts injecting electrons and another of said contacts simultaneously injecting holes into the space charge region, and means for biasing both of said contacts in the forward direction with respect to the underlying portion of said space-charge region to utilize the electrostatic interaction between the two types of carriers whereby control over the flow of current in the device is exerted.

2. In combination, a semiconductive device comprising a body of semiconductive material having regions of different electrical conductivity type material, a first biasing means for creating a space-charge region in said body, a P-type contact to said body within the confines of said space-charge region, said P-type contact injecting holes, an N-type contact to said body within the confines of said space-charge region, an output circuit comprising a suitable impedance element in series with said biasing means across said regions of different electrical conductivity-type material, said N-type contact simultaneously injecting electrons, and additional means for biasing said N-type and said P-type contacts in the forward direction with respect to the underlying portion of said space-charge region to exert control over the flow of current in said device by utilizing the electrostatic interaction between the two types of carriers.

3. In combination, a semiconductive device comprising a body of semiconductive material having regions of different electrical conductivity type material, means for creating a space-charge region in said body in the vicinity of a junction between said regions, an injector electrode in contact with said body, a modulator electrode in contact with said body, said contacts being included with the confines of said space-charge region, a current source connected between said modulator electrode and a reference point, capacitive means connected between said modulator electrode and said reference point, a current source connected between said injector electrode and said reference point, and capacitive means connected between said injector electrode and said reference point.

4. In combination, a semiconductive device comprising a body of semiconductive material having regions of different electrical conductivity type material separated by a junction, biasing means for creating a space-charge region in said body around said junction, a plurality of contacts to said body for controlling current carrier flow through said body, said contacts being included within the confines of said space-charge region and further having means connected to the contacts for biasing the contacts in the forward direction with respect to the underlying portion of said space-charge region for simultaneously injecting both electrons and holes into said space charge region to utilize the electrostatic interaction between the two types of carriers, means for applying a signal to be amplified between said contacts, and an output circuit comprising an impedance means in series with said first biasing means across said junction connected to said device.

References Cited in the file of this patent

UNITED STATES PATENTS

| | | |
|---|---|---|
| 2,717,342 | Pfann | Sept. 6, 1955 |
| 2,905,836 | Herold | Sept. 22, 1959 |
| 2,932,748 | Johnson | Apr. 12, 1960 |